United States Patent
Lee

(10) Patent No.: US 7,265,001 B2
(45) Date of Patent: Sep. 4, 2007

(54) METHODS OF FABRICATING SEMICONDUCTOR DEVICES

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 262 days.

(21) Appl. No.: 11/025,377

(22) Filed: Dec. 28, 2004

(65) Prior Publication Data

US 2005/0142834 A1 Jun. 30, 2005

(30) Foreign Application Priority Data

Dec. 31, 2003 (KR) .................. 10-2003-0101844

(51) Int. Cl.
*H01L 21/311* (2006.01)
*H01L 21/312* (2006.01)
*H01L 21/82* (2006.01)

(52) U.S. Cl. .................. 438/132; 438/601; 438/638

(58) Field of Classification Search ................ 438/638, 438/132, 601, 467
See application file for complete search history.

(56) References Cited

U.S. PATENT DOCUMENTS

| | | | | |
|---|---|---|---|---|
| 5,369,054 A | * | 11/1994 | Yen et al. ................ | 438/600 |
| 5,444,012 A | * | 8/1995 | Yoshizumi et al. .......... | 438/6 |
| 5,753,539 A | * | 5/1998 | Okazaki .................. | 438/132 |
| 5,759,877 A | | 6/1998 | Crafts et al. | |
| 5,851,903 A | * | 12/1998 | Stamper ................ | 438/467 |
| 5,963,825 A | | 10/1999 | Lee et al. | |
| 6,008,075 A | * | 12/1999 | Lien et al. ................ | 438/132 |
| 6,096,579 A | * | 8/2000 | Liao et al. ................ | 438/131 |
| 6,180,503 B1 | * | 1/2001 | Tzeng et al. ............... | 438/601 |
| 6,235,557 B1 | * | 5/2001 | Manley .................... | 438/132 |
| 6,294,474 B1 | * | 9/2001 | Tzeng et al. ............... | 438/710 |
| 6,440,833 B1 | * | 8/2002 | Lee et al. ................ | 438/601 |
| 6,509,255 B2 | * | 1/2003 | Minn et al. ............... | 438/601 |
| 6,664,141 B1 | * | 12/2003 | Castagnetti et al. ........ | 438/132 |
| 6,677,195 B2 | * | 1/2004 | Tsuura ..................... | 438/215 |
| 6,828,653 B1 | * | 12/2004 | Castagnetti et al. ........ | 257/529 |
| 6,846,705 B2 | * | 1/2005 | Lee ........................ | 438/132 |
| 2005/0067671 A1 | * | 3/2005 | Park et al. ............... | 257/529 |

FOREIGN PATENT DOCUMENTS

KR 2004108223 * 12/2004

* cited by examiner

*Primary Examiner*—M. Wilczewski
(74) *Attorney, Agent, or Firm*—Andrew D. Fortney

(57) ABSTRACT

Disclosed are methods of fabricating a semiconductor device, by which the pad and fuse layers play their roles smoothly and to enhance a quality of a final semiconductor device. According to one example, a disclosed method includes forming an insulating layer covering a pad and a fuse on prescribed portions of a substrate, simultaneously forming a first trench exposing an anti-reflective coating layer provided as a top layer of the pad and a second trench having a portion of the insulating layer underneath over the fuse by selectively removing the first insulating layer, filling up the first and second trenches with an etch rate adjustment layer, exposing the anti-reflective coating layer to leave a portion of the etch rate adjustment layer within the second trench by selectively removing the etch rate adjustment layer, and simultaneously removing the anti-reflective coating layer and the portion of the etch rate adjustment layer from the second trench.

20 Claims, 7 Drawing Sheets

METHODS OF FABRICATING SEMICONDUCTOR DEVICES

TECHNICAL FIELD

The present disclosure relates to semiconductor devices and, more particularly to methods of fabricating semiconductor devices.

BACKGROUND

Generally, a supplementary redundancy cell is arranged on a memory cell periphery of a semiconductor device to prepare for the failure of a corresponding memory cell. The redundancy cell is connected to the memory cell via a fuse layer in the vicinity of the memory cell.

For instance, a fuse layer of a semiconductor device according to a related art is disclosed in detail in U.S. Pat. No. 5,759,877 for 'Semiconductor fuse structure', U.S. Pat. No. 5,963,825 for 'Method of fabrication of semiconductor fuse with polysilicon plate', 'Semiconductor memory device with identification fuse', or the like.

Generally, in case of the failure of a specific memory cell, the fuse layer connected to the specific memory cell is cut to isolate the specific memory cell from a circuit block. If the fuse layer is embedded within a structure of the semiconductor device, there exists a problem that the corresponding structure interrupts the process of cutting the fuse layer. In the related art, to solve the problem, a fuse layer is formed on a top layer of a semiconductor substrate to be exposed to an atmosphere. Hence, the fuse layer cutting process is facilitated without any obstacle.

In doing so, because the fuse layer is generally formed of metal and because the fuse layer is open to air, corrosion of the metal is inevitable. Considering the corrosion problem, a sort of an insulating layer is left on a fuse layer in fabricating a semiconductor device to play a role as a buffer layer. Hence, the unexpected corrosion of the fuse layer can be prevented.

As proposed in Korean Patent Application No. 1998-6141 for 'Pad and fuse open process' or Korean Patent Application No. 2000-26808 for 'Method of forming fuse in semiconductor device', the related art fuse layer is etched/formed together with a pad layer.

In case of etching/fabricating both pad and fuse layers, a step of removing an anti-reflective coating layer, e.g., a TiN layer, is provided to a top of the pad layer and a step of removing an insulating layer, e.g., an oxide layer, on the fuse layer are carried out by the same etch process. Yet, the anti-reflective coating layer provided to the top of the pad layer and the insulating layer on the fuse layer differ from each other in material. For instance, the anti-reflective coating layer has a relatively low etch rate and the insulating layer has an etch rate faster than that of the anti-reflective coating layer. Hence, even if the etch process for removing the anti-reflective coating layer and the insulating layer is collectively initiated at the same time, it is still difficult to simultaneously pattern them with a satisfactory result.

In case of carrying out a series of etch processes using the anti-reflective coating layer as the TiN layer as a target layer, it is advantageous that the anti-reflective coating layer provided to an outer side of the pad layer can be completely removed. Yet, in such a case, the insulating layer on the fuse layer is unnecessarily over-etched to bring about a problem that the fuse layer is exposed to the air.

On the contrary, in case of carrying out an etch process using the oxide layer as a target, the insulating layer remains on the fuse layer to prevent the corrosion of the fuse layer. Yet, in such a case, the anti-reflective coating layer of the pad layer fails to be fully removed to bring about a problem that a portion of the anti-reflective coating layer still remain on the outer side of the pad layer.

Hence, if the fuse layer is exposed to the air without a separate buffer layer, the exposed fuse layer reacts with oxygen in the air to accelerate its corrosion. Hence, the fuse layer is unable to play its normal role, whereby a quality of the semiconductor device is degraded.

On the other hand, if the anti-reflective coating layer remains on the outer side of the pad layer, adhesiveness with a wire bonded to the pad layer is abruptly lowered, the pad layer is discolored, and Galvanic corrosion occurs due to an electronegativity difference between a main metal layer, e.g., Al/Cu layer, of the pad layer and the anti-reflective coating layer. Hence, the quality of the semiconductor device is degraded as well.

DETAILED DESCRIPTION

Disclosed herein are methods of fabricating a semiconductor device in which a series of etch rate adjusting layer forming procedures are additionally performed in an etch process for removing an anti-reflective coating layer and an insulating layer to induce stable compensation of an etch rate difference between the anti-reflective coating layer and the insulating layer and by which the anti-reflective coating layer is removed from the final pad layer with the insulating layer remaining on the final fuse layer.

Figure 1A:
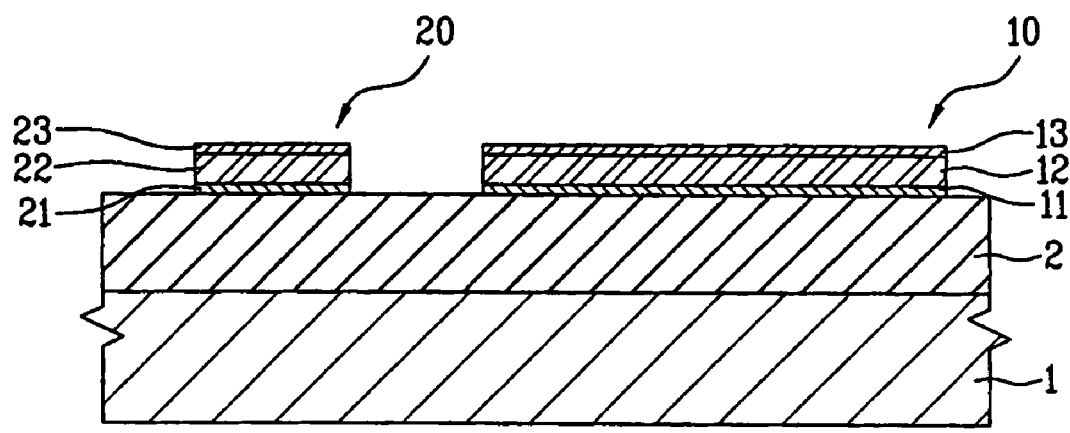
FIGS. 1A to 1I are cross-sectional diagrams of a semiconductor structure for explaining a first disclosed method of fabricating a semiconductor device.

Referring to FIG. 1A, a prescribed layer 2 is formed on a semiconductor substrate 1. Barrier metal layers 11 and 21, a main metal layers 12 and 22, and anti-reflective metal layers 13 and 23 are stacked on the prescribed layer 2 and are then patterned by a series of sputtering processes and photolithography to form a metal layer 20 and a fuse layer 10. In doing so, the barrier layers 11 and 21 may be formed of TiN/Ti, the main metal layers 12 and 22 may be formed of Al/Cu, and the anti-reflective metal layers 13 and 23 may be formed of TiN.

Figure 1B:
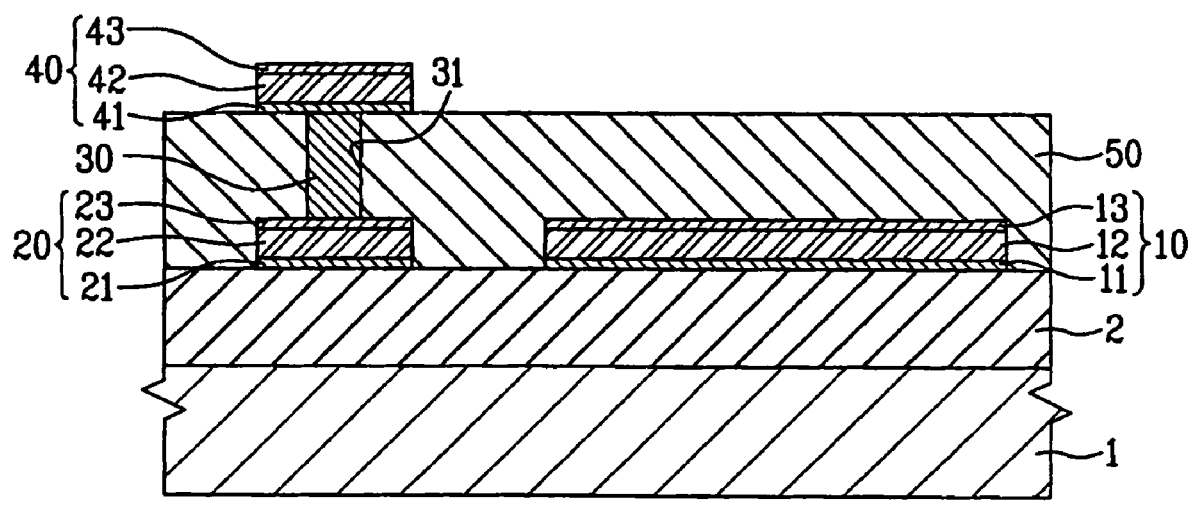

Referring to FIG. 1B, a first insulating layer 50 is formed on the prescribed layer 2 including the metal and fuse layers 20 and 10 by plasma chemical vapor deposition (CVD). In doing so, the first insulating layer 50 may be formed of plasma enhanced tetraethylorthosilicate (PE-TEOS). The first insulating layer 50 can be formed of a different material.

A photoresist pattern (not shown in the drawing) is formed on the first insulating layer 50 to expose portion of the first insulating layer 50 overlapped with the metal layer 20. The exposed portion of the first insulating layer 50 is then etched to form a contact hole 31 exposing a portion of the metal layer 20.

After the photoresist pattern has been removed, a contact plug 30 filing up the contact hole 31 of the first insulating layer 50 is formed by a series of sputtering and polishing procedures.

After the contact plug 30 has been formed on the exposed portion of the first insulating layer 50, i.e., the metal layer 20, a barrier layer 41, a main metal layer 42, and an anti-reflective coating layer 43 are stacked on the first insulating layer 50. The anti-reflective coating layer 43, the main metal layer 42, and the barrier layer 41 are etched by photolithography to form a pad layer 40 electrically connected with the contact plug 30. In doing so, the barrier layer 41 of the pad layer 40 can be formed of TiN/Ti, the main metal layer 42 may be formed of Al/Cu, and the anti-reflective coating layer 43 may be formed of TiN.

Figure 1C:
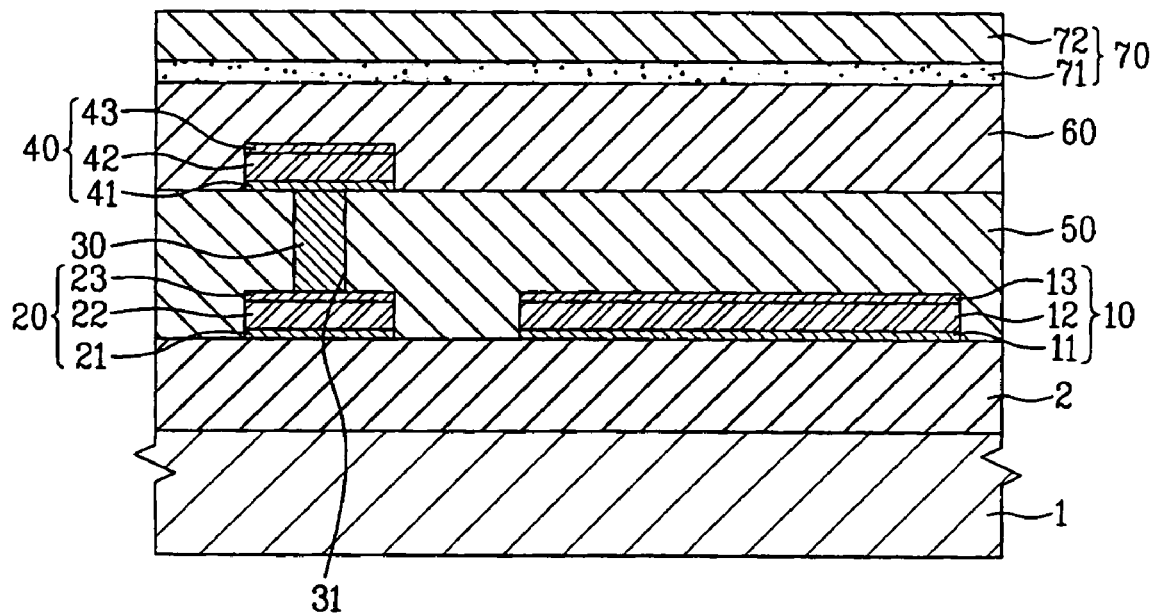

Referring to FIG. 1C, a second insulating layer 60 is formed on the first insulating layer 50, including the pad layer 40, by plasma CVD. In doing so, the second insulating layer 60 can be formed of PE-TEOS. Of course, the second insulating layer 60 can be formed of a different material.

A third insulating layer 70 is formed on the second insulating layer 60 by plasma CVD. In doing so, an oxide layer 71 and a nitride layer 72 are sequentially stacked on the second insulating layer 60 to form the third insulating layer 70. The oxide layer 71 may be formed of PE-TEOS and the nitride layer 72 may be formed of PE-SiN. Of course, the third insulating layer 70 can be formed of different materials.

Figure 1D:
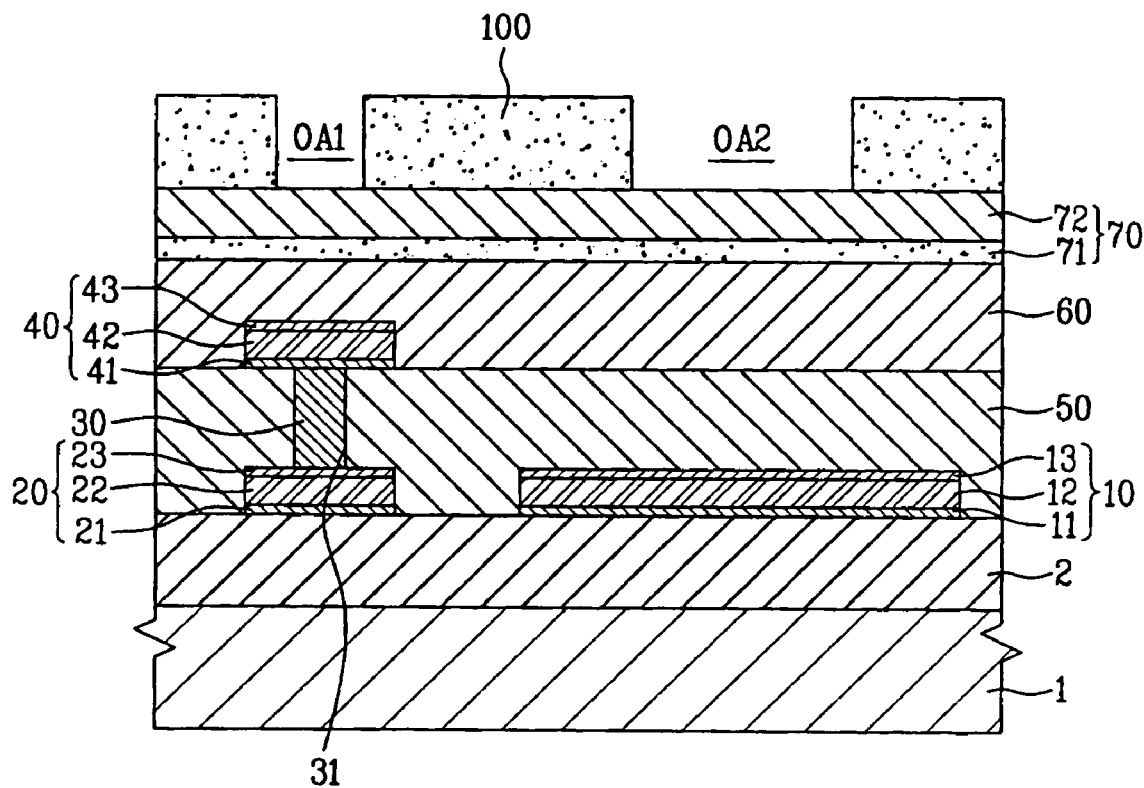

Referring to FIG. 1D, photoresist is coated on the third insulating layer 70. Exposure and development are carried out on the photoresist to form a photoresist pattern 100 defining open holes OA1 and OA2.

Figure 1E:
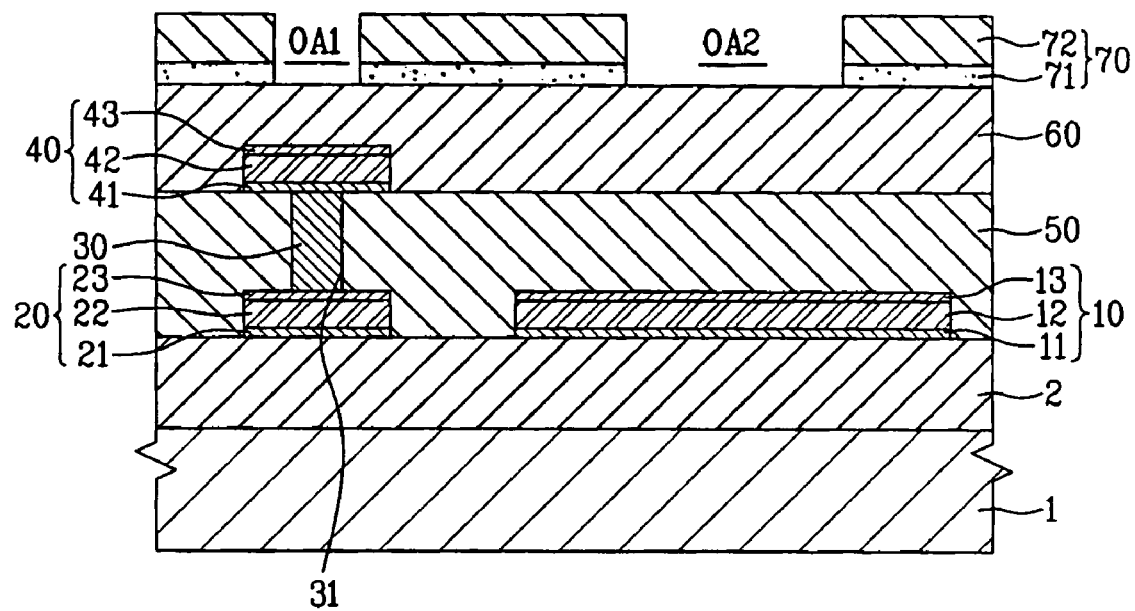

Referring to FIG. 1E, portions of the third insulating layer 70 are etched using the photoresist pattern 100 as an etch mask to expose portions of the second insulating layer 60. Hence, open holes OA1 and OA2 are formed.

Figure 1F:
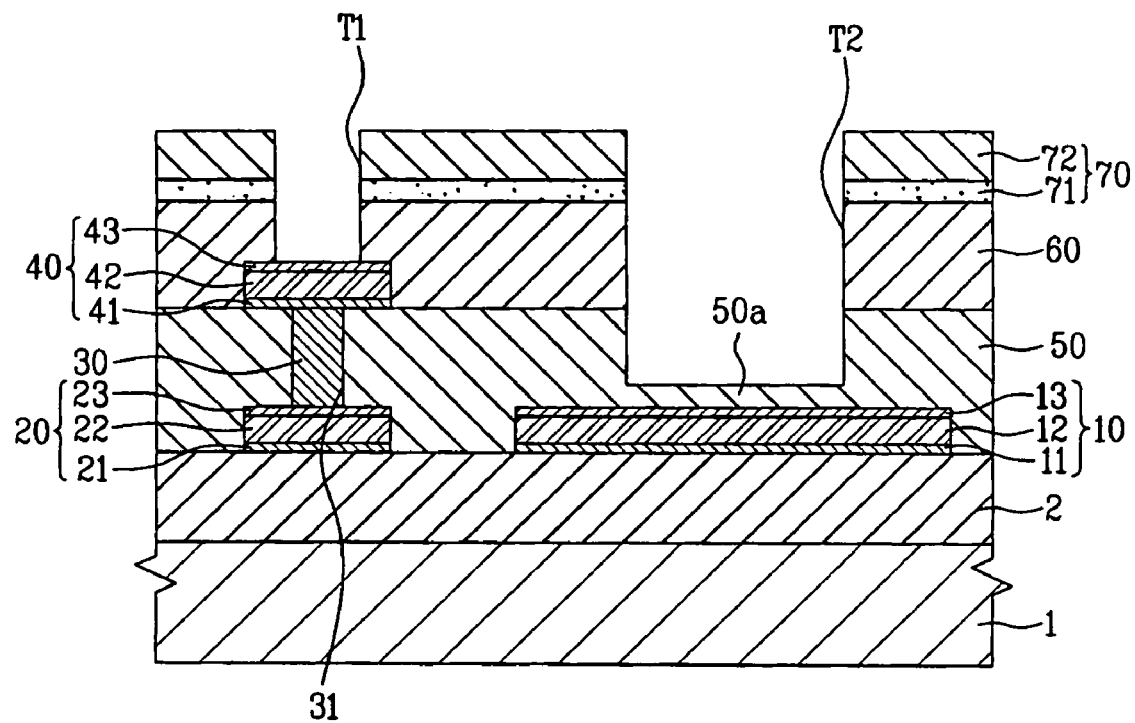

Referring to FIG. 1F, the exposed portions of the second insulating layer 60 and the corresponding first insulating layer 50 are anisotropically etched by reactive ion etch (RIE) to form simultaneously a first trench T1 exposing the pad layer 40 and a second trench T2 exposing the fuse layer 10. In doing so, the second trench T2 may be formed to have a larger opening than the first trench T1.

In doing so, a time point enabling a portion of the insulating layer 50a to remain on the fuse layer 10 is set as an etch stop point. The reactive ion etch is carried out to form the first and second trenches T1 and T2 until the etch stop point is reached. Hence, even if the first and second trenches T1 and T2 are simultaneously formed, the insulating layer 50a is not removed, but remains on the fuse layer 10.

Naturally, the anti-reflective coating layer 43 having an etch rate lower than that of the insulating layer 50a, i.e., the oxide layer, is not removed but is exposed via the first trench T1 only.

Figure 1G:
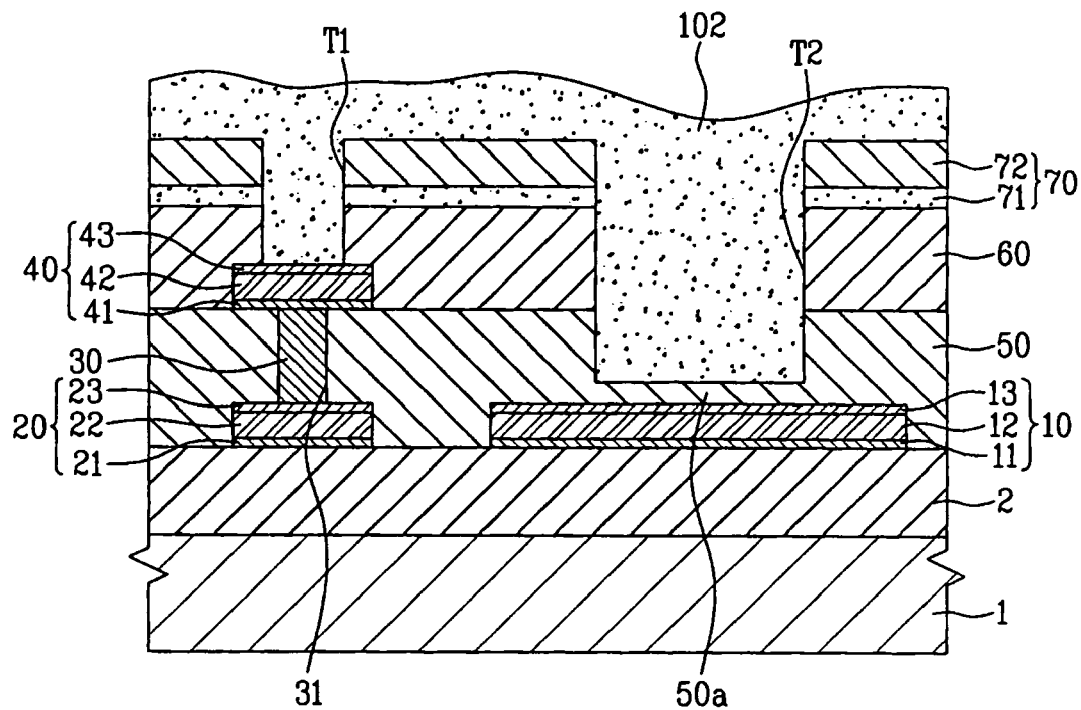

Referring to FIG. 1G, an etch rate adjustment layer 102 is formed on the third insulating layer 70 to fill up the first and second trenches T1 and T2 by spin coating. Preferably, the etch rate adjustment layer 102 is formed of photoresist.

Figure 1H:
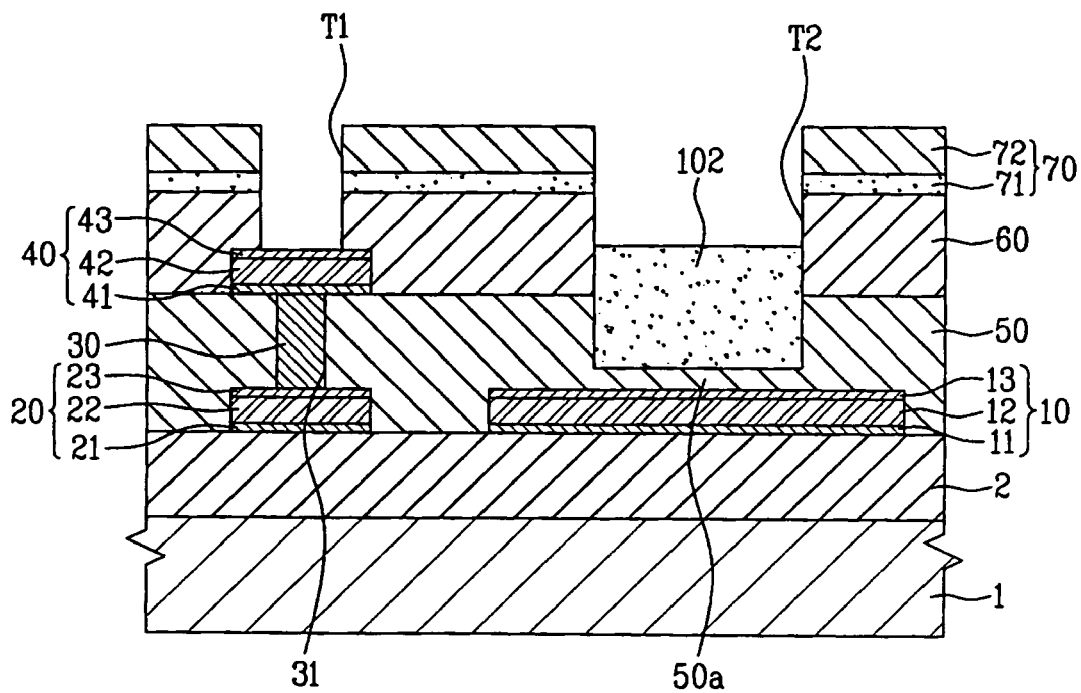

Referring to FIG. 1H, a blanket exposure process is carried out on the etch rate adjustment layer 102 to embody latent images corresponding to shapes of the first and second trenches T1 and T2 within the etch rate adjustment layer 102.

Subsequently, the etch rate adjustment layer 102 filling the first and second trenches T1 and T2 are selectively removed by etching back the etch rate adjustment layer 102 along the latent images by RIE or the like.

Because the second trench T2 is formed to be larger than the first trench T1 in size (width, depth), an amount of the etch rate adjustment layer 102 filling the second trench T2 may be greater than that of the etch rate adjustment layer 102 filling the first trench T1. This results in an etch amount difference between the etch rate adjustment layer 102 filling the second trench T2 and the etch rate adjustment layer 102 filling the first trench T1. Hence, a portion of the etch rate adjustment layer 102 can remain in the second trench T2 at a time point of exposing the anti-reflective coating layer 43 of the pad layer 40 via the first trench T1.

Figure 1I:
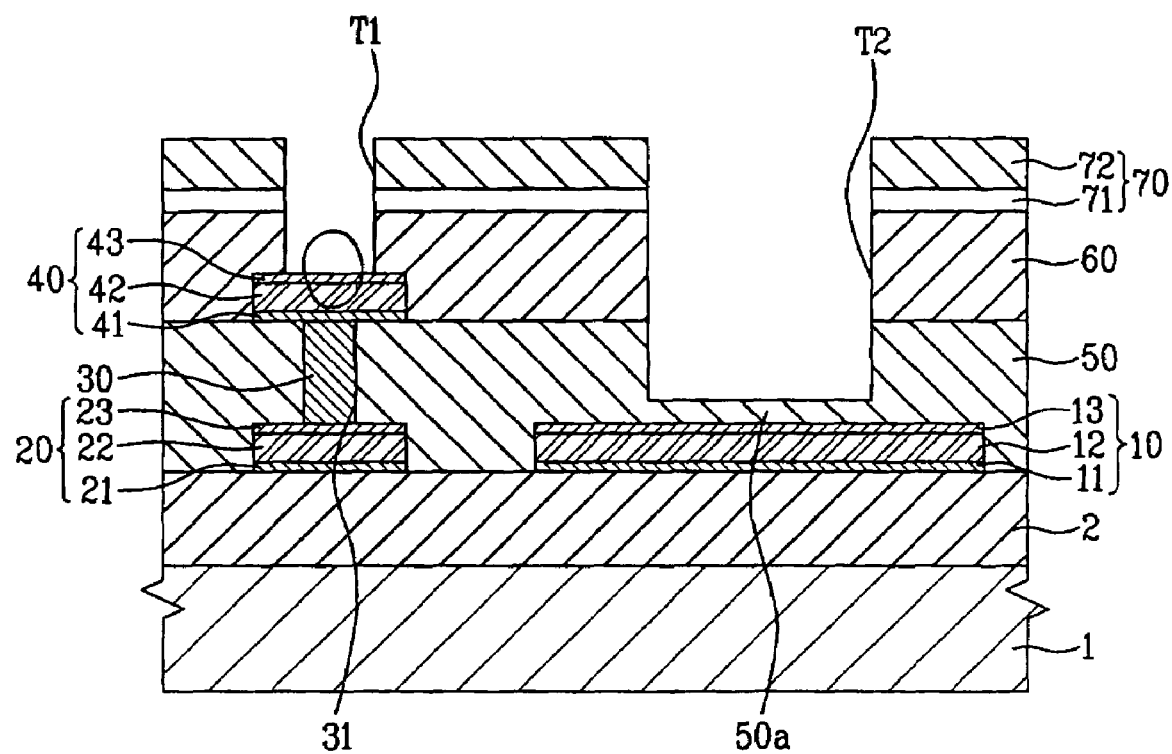

Referring to FIG. 1I, the exposed anti-reflective coating layer 43 and the reaming etch rate adjustment layer 102 in the second trench T2 are simultaneously removed by anisotropic etch such as RIE. In doing so, a time point enabling the anti-reflective coating layer 43 of the pad layer 40 to be removed is set as an etch stop point to stop the RIE.

The etch rate adjustment layer 102, which remains over the fuse layer 10, is removed on behalf of the insulating layer 50a while the anti-reflective coating layer 43 of the pad layer 40 is removed. Hence, after completion of the corresponding RIE, the insulating layer 50a still remains on the fuse layer 10 at the time point of completely removing the anti-reflective coating layer 43 from the top of the pad layer 40. Thus, the anti-reflective coating layer 43 is completely removed from the pad layer 40 and the insulating layer 50a remains on the fuse layer 10.

As disclosed herein, the problems attributed to the remaining anti-reflective coating layer 43 in the related art are solved. For instance, adhesiveness with a wire bonded to the pad layer 40 is not abruptly lowered, the pad layer 40 is not discolored, Galvanic corrosion fails to occur due to an electronegativity difference between the main metal layer 42 and the anti-reflective coating layer 43, and the fuse layer 10 is not corroded due to the remaining insulating layer.

In case that the problems according to the etch rate difference between the anti-reflective coating layer 43 and the insulating layers 50, 60, and 70 are solved, the pad and fuse layers 40 and 10 can normally play their roles, whereby a quality of the final semiconductor device is not degraded.

Meanwhile, as disclosed herein, viscosity of the etch rate adjustment layer 102, i.e., the photoresist layer, is a very important parameter. If the viscosity of the etch rate adjustment layer 102 is too low, a phase of the etch rate adjustment layer 102 becomes soft. Hence, it may be difficult to perform etch-back to fit profiles of the first and second trenches T1 and T2. If the viscosity of the etch rate adjustment layer 102 is too high, a phase of the etch rate adjustment layer 102 becomes hard. Hence, it may be difficult to etch the etch rate adjustment layer 102 and to take too much time in removing the etch rate adjustment layer 102.

As disclosed herein, the viscosity of the etch rate adjustment layer 102 may be set to 30~35 cp, and, in particular, may be set to about 32 cp to optimize the phase of the etch rate adjustment layer 102. Hence, the etch rate adjustment layer 102 can normally play its role.

As will be readily appreciated by those having ordinary skill in the art, various modifications can be made to the methods disclosed herein.

Figure 2A:
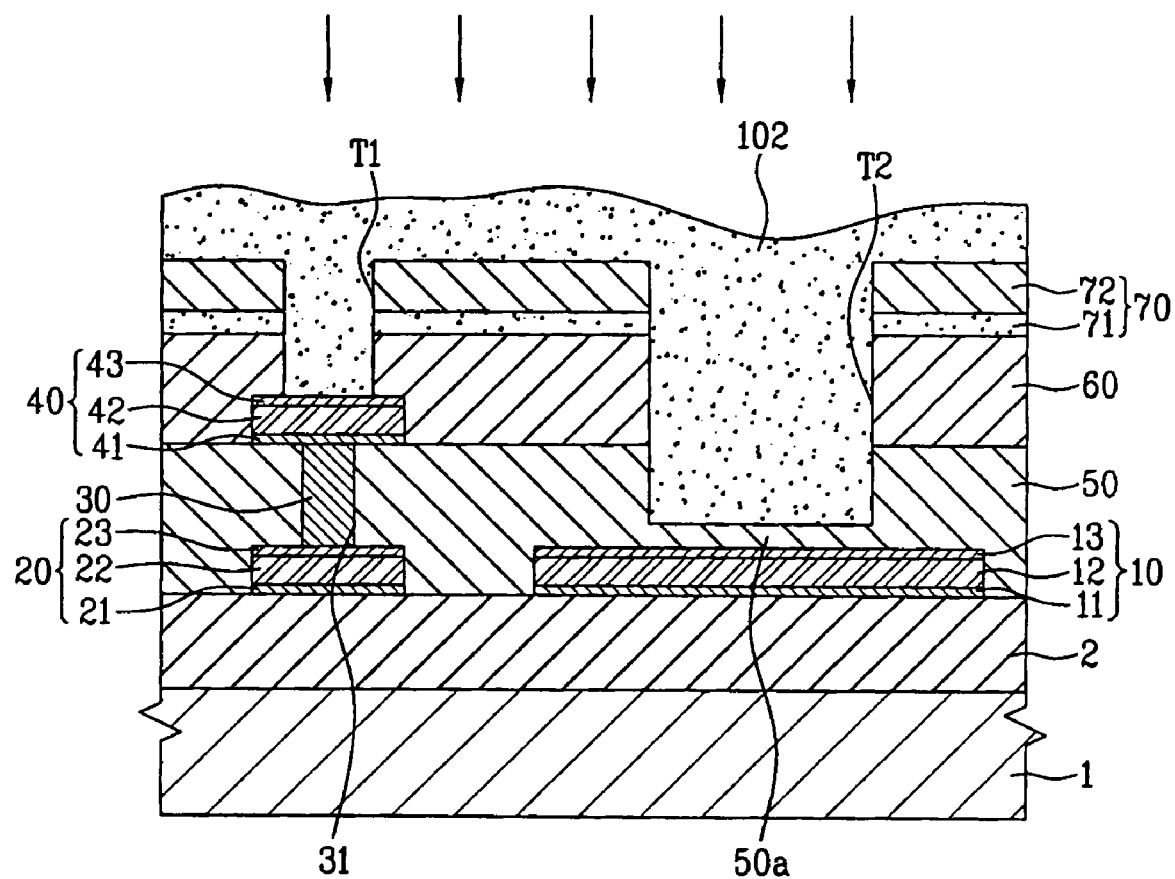
FIG. 2A and FIG. 2B are cross-sectional diagrams of a semiconductor structure for explaining a second disclosed method of fabricating a semiconductor device.
Figure 2B:
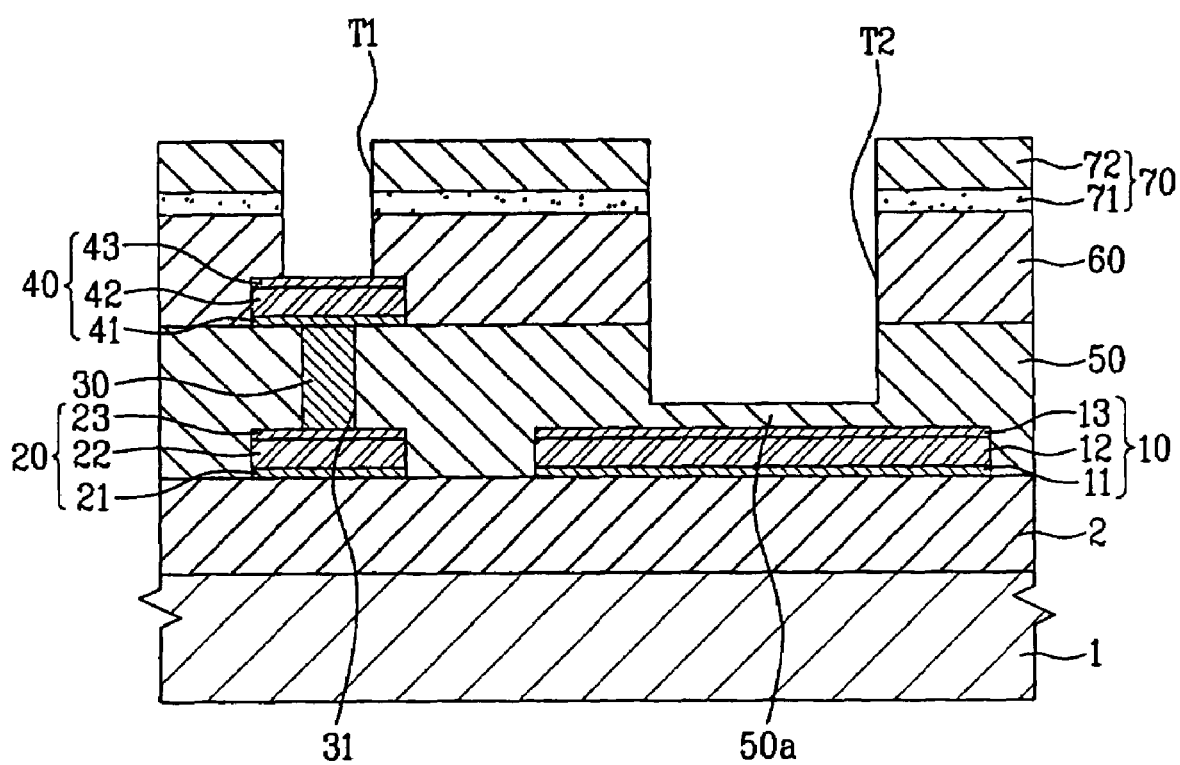

Referring to FIG. 2A and FIG. 2B, a method of fabricating a semiconductor device according to another a second example includes forming an etch rate adjustment layer 102 on a third insulating layer 70 to fill up first and second trenches T1 and T2, collectively removing the etch rate adjustment layer 102 from the first and second trenches T1 and T2 by one-step reactive ion etch to remove an anti-reflective coating layer 43 from a topside of a pad layer 40 and to leave a portion of an insulating layer 50a on a fuse layer 10.

Hence, the second example disclosed method excludes leaving a portion of the etch rate adjustment layer 102 in the second trench T2, thereby simplifying the overall process steps to enhance process efficiency. Thus, the anti-reflective coating layer 43 is completely removed from the pad layer 40 and the insulating layer 50a remains on the fuse layer 10.

Therefore, the second example disclosed method solves the problems attributed to the remaining anti-reflective coating layer 43 in the related art. For instance, adhesiveness with a wire bonded to the pad layer 40 is not abruptly lowered, the pad layer 40 is not discolored, Galvanic corrosion fails to occur due to an electronegativity difference between the main metal layer 42 and the anti-reflective coating layer 43, and the fuse layer 10 is not corroded due to the remaining insulating layer.

As disclosed herein, a series of etch rate adjusting layer forming procedures are additionally performed in the middle of an etch process for removing an anti-reflective coating layer and an insulating layer to induce stable compensation of an etch rate difference between the anti-reflective coating layer and the insulating layer and the anti-reflective coating layer is removed from the final pad layer with the insulating layer remaining on the fuse layer.

Additionally, adhesiveness with a wire bonded to the pad layer is not abruptly lowered, the pad layer is not discolored, Galvanic corrosion fails to occur due to an electronegativity difference between a main metal layer, e.g., Al/Cu layer, of the pad layer and the anti-reflective coating layer, and the fuse layer is not corroded due to the remaining insulating layer.

Moreover, as disclosed herein, the problems due to the etch rate difference between the anti-reflective coating layer and the insulating layer are solved to enable the pad and fuse layers to play their roles smoothly and a quality of a final semiconductor device can be enhanced.

The disclosed methods include a series of etch rate adjusting layer forming procedures that are additionally performed in the middle of an etch process for removing an anti-reflective coating layer and an insulating layer to induce stable compensation of an etch rate difference between the anti-reflective coating layer and the insulating layer and by which the anti-reflective coating layer is removed from the final pad layer with the insulating layer remaining on the fuse layer.

Additionally, the disclosed method of fabricating a semiconductor device results in a device in which adhesiveness with a wire bonded to the pad layer is not abruptly lowered, the pad layer is not discolored, Galvanic corrosion fails to occur due to an electronegativity difference between a main metal layer, e.g., Al/Cu layer, of the pad layer and the anti-reflective coating layer, and the fuse layer is not corroded due to the remaining insulating layer.

Additionally, the disclosed methods result in devices by which the problems due to the etch rate difference between the anti-reflective coating layer and the insulating layer are solved to enable the pad and fuse layers to play their roles smoothly and by which a quality of a final semiconductor device can be enhanced.

According to one example, a disclosed method includes forming an insulating layer covering a pad and a fuse on prescribed portions of a substrate, simultaneously forming a first trench exposing an anti-reflective coating layer provided as a top layer of the pad and a second trench having a portion of the insulating layer underneath over the fuse by selectively removing the first insulating layer, filling up the first and second trenches with an etch rate adjustment layer, exposing the anti-reflective coating layer to leave a portion of the etch rate adjustment layer within the second trench by selectively removing the etch rate adjustment layer, and simultaneously removing the anti-reflective coating layer and the portion of the etch rate adjustment layer from the second trench.

In one example, the second trench is formed bigger than the first trench in size. Additionally, the etch rate adjustment layer is formed of photoresist, the viscosity of which may be between about 30 and about 35 cp. The etch rate adjustment layer may be formed by spin coating.

Exposing the anti-reflective coating layer exposing may include carrying out blanket exposure on the etch rate adjustment layer to embody latent images corresponding to shapes of the first and second trenches within the etch rate adjustment layer and selectively removing the etch rate adjustment layer by etch-back along the latent images.

According to a second disclosed example, a method may include forming an insulating layer covering a pad and a fuse on prescribed portions of a substrate, simultaneously forming a first trench exposing an anti-reflective coating layer provided as a top layer of the pad and a second trench having a portion of the insulating layer underneath over the fuse by selectively removing the first insulating layer, filling up the first and second trenches with an etch rate adjustment layer, and selectively removing the etch rate adjustment layer from the first and second trenches to remove the anti-reflective coating layer and to leave the portion of the insulating layer on the fuse.

In such an arrangement, the second trench is formed bigger than the first trench in size. Additionally, the etch rate adjustment layer may be formed of photoresist and may have a viscosity of about 30 to about 35 cp. The etch rate adjustment layer may be formed by spin coating.

This application claims the benefit of the Korean Application No. P2003-0101844 filed on Dec. 31, 2003, which is hereby incorporated by reference.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device, comprising:
   forming an insulating layer covering a pad and a fuse on prescribed portions of a substrate;
   simultaneously forming a first trench exposing an anti-reflective coating layer provided as a top layer of the pad and a second trench having a portion of the insulating layer underneath over the fuse by selectively removing the insulating layer;
   filling the first and second trenches with an etch rate adjustment layer;
   exposing the anti-reflective coating layer and leaving a portion of the etch rate adjustment layer within the second trench by selectively removing the etch rate adjustment layer; and
   simultaneously removing the anti-reflective coating layer and the portion of the etch rate adjustment layer from the second trench.

2. A method as defined by claim 1, wherein the second trench is formed bigger than to first trench in size.

3. A method as defined by claim 1, wherein the etch rate adjustment layer comprises a photoresist.

4. A method as defined by claim 3, wherein a viscosity of the photoresist is between about 30 and about 35 cp.

5. A method as defined by claim 1, wherein the etch rate adjustment layer is formed by spin coating.

6. A method as defined by claim 1, wherein exposing the anti-reflective coating layer comprises:
carrying out blanket exposure on the etch rate adjustment layer to embody latent images corresponding to shapes of the first and second trenches within the etch rate adjustment layer; and
selectively removing the etch rate adjustment layer by etch-back along the latent images.

7. A method as defined by claim 1, wherein the insulating layer comprises plasma enhanced tetraethylorthosilicate (PE-TEOS).

8. A method as defined by claim 1, wherein the anti-reflective coating layer comprises TiN.

9. A method as defined by claim 1, wherein forming the insulating layer comprises plasma CVD.

10. A method as defined by claim 1, wherein the anti-reflective coating layer and the portion of the etch rate adjustment layer are simultaneously removed from the second french by reactive ion etching (RIE).

11. A method of fabricating a semiconductor device, comprising:
forming an insulating layer covering a pad and a fuse on prescribed portions of a substrate, the pad having an anti-reflective coating as a top layer;
selectively removing the insulating layer to simultaneously form a first trench exposing the anti-reflective coating layer and a second trench having a portion of the insulating layer underneath and over the fuse;
filling the first and second trenches with an etch rate adjustment layer comprising a photoresist; and
selectively removing the etch rate adjustment layer from the first and second trenches to remove the anti-reflective coating layer and to leave the portion of the insulating layer on the fuse.

12. A method as defined by claim 11 wherein the second trench is bigger than the first trench in size.

13. A method as defined by claim 11, wherein the etch rate adjustment layer is formed by spin coating.

14. A method as defined by claim 11, further comprising blanket exposing the etch rate adjustment layer to embody latent images corresponding to shapes of the first and second trenches within the etch rate adjustment layer.

15. A method as defined by claim 14, further comprising removing the etch rate adjustment layer by etch-back along the latent images.

16. A method as defined by claim 11, wherein a viscosity of the photoresist is between about 30 and about 35cp.

17. A method of fabricating a semiconductor device, comprising:
forming an insulating layer covering a pad and a fuse on prescribed portions of a substrate, the pad comprising a top anti-reflective coating layer;
selectively removing the insulating layer to simultaneously form a first french exposing the anti-reflective coating layer and a second trench having a portion of the insulating layer under the second trench and over the fuse;
forming an etch rate adjustment layer by spin coating such that the etch rate adjustment layer fills the first and second trenches; and
selectively removing the etch rate adjustment layer from the first and second trenches, to remove the anti-reflective coating layer and leave the portion of the insulating layer on the fuse.

18. A method as defined by claim 17, wherein the etch rate adjustment layer comprises a photoresist.

19. A method as defined by claim 18, wherein a viscosity of the photoresist is between about 30 and about 35cp.

20. A method as defined by claim 17, wherein the second trench has a size bigger than the first trench.

* * * * *